United States Patent [19]

Kilburn

[11] Patent Number: 5,240,555
[45] Date of Patent: Aug. 31, 1993

[54] METHOD AND APPARATUS FOR CLEANING SEMICONDUCTOR ETCHING MACHINES

[75] Inventor: John I. Kilburn, Rochester, N.Y.

[73] Assignee: Eastman Kodak Company, Rochester, N.Y.

[21] Appl. No.: 869,590

[22] Filed: Apr. 16, 1992

[51] Int. Cl.$^5$ .................. B44C 1/22; C03C 15/00; H01L 21/306

[52] U.S. Cl. ........................ 156/643; 134/1; 156/657; 156/659.1; 156/662; 156/345

[58] Field of Search ............ 156/643, 646, 657, 659.1, 156/662, 345; 134/1, 31; 204/298.31, 298.35, 298.34, 192.32, 192.37; 427/38, 39; 118/250.1, 620, 723, 728

[56] References Cited

U.S. PATENT DOCUMENTS

| | | | |
|---|---|---|---|
| 4,576,698 | 3/1986 | Gallagher et al. | 156/643 X |
| 4,657,616 | 4/1987 | Benzing et al. | 156/345 |
| 4,985,113 | 1/1991 | Fujimoto et al. | 156/643 |
| 5,114,529 | 5/1992 | Masuyama et al. | 134/1 X |
| 5,158,644 | 10/1992 | Cheung et al. | 156/643 |

Primary Examiner—William A. Powell
Attorney, Agent, or Firm—Stephen C. Kaufman

[57] ABSTRACT

A method and apparatus for cleaning polymer contamination within etching machines during the processing of semiconductor wafers includes the use of a polygonal cleaning wafer on an electrode within the etching chamber during an oxygen plasma cleaning operation. Normal etching of semiconductor wafers in the chamber results in a build-up of deposits (polymer contamination) of the semiconductor wafer etch processing on walls of the etching chamber and on the electrode. The polygonal cleaning wafer, which is typically octagonal, exposes an annular ring of on a supporting electrode adjacent to each flat of the octagonal cleaning wafer. The cleaning wafer is preferably made of the same material as the interior of the etching machine to avoid contamination by foreign elements The presence of the cleaning wafer enables sensing circuits within the etching machine to activate radio frequency power which is used to create an oxygen plasma.

17 Claims, 1 Drawing Sheet

METHOD AND APPARATUS FOR CLEANING SEMICONDUCTOR ETCHING MACHINES

FIELD OF THE INVENTION

This invention relates to a method and apparatus for the removal of deposits in an etching chamber of an etching machine, and, more particularly, to removal of polymer contamination which accumulates during the plasma assisted etching of various layers during the fabrication of semiconductor wafers.

BACKGROUND OF THE INVENTION

The commercial fabrication of semiconductor chips is done in the form of wafers which are typically four to eight inches in diameter. Usually, there are more than 100 processing steps in the fabrication which include oxidation, diffusion, ion implantation, deposition of conductors and insulators, photolithography, and etching. Various conducting and insulating layers are deposited uniformly over the wafer to a thickness of a few microns. Photolithography, in a subtractive process, defines areas within the deposited layers which are to be retained by protecting them with an etch resistant layer, and exposing areas which are to be removed by etching.

Two trends in semiconductor processing technology make the etching step more critical. First, the increased functionality of each chip requires a greater packing density within each chip and therefore finer lines for conductors and smaller openings in insulating layers. Second, increased reliability of semiconductor circuits is achieved with materials that are chemically impervious and also resistant to diffusion. Conductors are often formed from refractory metal silicides, such as the silicides of tantalum or titanium. Insulating layers are typically formed from silicon dioxide or silicon nitride. These layers provide excellent insulation and also serve to prevent the diffusion into the chip of harmful contaminants.

The fine features in the circuit and the chemical inertness of the layers preclude wet chemical etching which produces a tapered edge in a feature. The width of some features is comparable to the thickness of the film from which they are etched. Any taper or lack of control in producing the taper severely limits the ratio of feature width to thickness.

These problems are overcome by the use of radio frequency (rf) energy to create a plasma of extremely reactive ions within an etching chamber of an etching machine. The interior of the chamber is evacuated to remove atmospheric gases and water vapor. Selected gases are then admitted into the chamber at a controlled flow rate. The gases typically contain chlorine or fluorine atoms, and they may be extremely inert in the atmosphere. However, these gases become ionized in the presence of rf energy at the reduced pressure in the etching chamber. The ions have the ability to remove silicon oxide or silicon nitride, and to do so with much less taper in the wall of a feature than with conventional wet chemical etching. A variation of plasma etching, called reactive ion etching, causes the active ions to impinge upon the layer with a momentum. This further reduces the taper.

Production in-line plasma etching machines, for example, a machine marketed under the trade name "Plasma-Therm, Model A360 or A368", are available. A series of semiconductor wafers are placed in an input chamber of the etching machine which is evacuated with a vacuum pump. Each wafer is then transported in turn to an etching chamber of the etching machine and placed on an electrode contained therein. A gas, or a mixture of gases, is ionized by rf energy to form a plasma within the chamber. The rf energy is only supplied if the sensors within the machine indicate that a wafer is present on the electrode which supplies the energy. The chamber walls are grounded. The ions combine with areas of the top layer of the wafer which are not protected with a photographically defined masking layer (e.g., silicon nitride). Most of the by-products of this reaction, and the by-products of a lesser reaction with the masking layer, are pumped away by a vacuum pump which maintains a constant pressure within the etching chamber. However, some of these by-products deposit as a solid polymer on interior walls of the chamber and upon the electrode supporting the wafer.

Typically semiconductor wafers are circular with one or more flats ground on the circumference. These flats serve to identify the crystallographic orientation of the wafer. The random placement of many wafers on the supporting electrode and the etching of each ultimately causes the formation of an annular ring of polymer near the outer edge of the electrode where the electrode is not covered by the flat of the wafer.

After many wafers have been etched, the polymer deposit on the electrode outer circumference supporting the wafer becomes thick enough to interfere with the wafer's contact with the electrode. This results in non-uniform etching across the wafer as well as missed transfers due to a wafer sticking to polysilicon buildup on the electrode. Non-uniformity exceeding seven percent is beyond some specified limits in turn affecting side wall profile variance across the wafer. Experience in some fabrication facilities has shown that this level is reached after 100 to 150 wafers have been processed. It is then necessary to vent the chamber and remove the annular ring of polymer with a manual solvent wiping operation. The chamber must then be requalified before returning to production. This causes considerable down-time and also raises the possibility of contamination entering the chamber when it is exposed to the atmosphere.

It is desirable to clean the build up of polymer deposits on interior walls of an etching chamber and the polymer ring formed on the electrode of an etching machine, such as the aforementioned Model A360, without opening the etching chamber. This would increase production efficiency and reduce the possibility of contamination from the atmosphere.

SUMMARY OF THE INVENTION

The present invention is directed to an etching machine and to a method of operating the same.

The etching machine of the present invention defines a polymer etching chamber which contains an electrode which is adapted to support semiconductor wafers containing work product and a special cleaning wafer. Semiconductor wafers, which each typically have a flat, are flat oriented sequentially etched in the etching chamber.

After many semiconductor wafers have been etched, a build-up of deposits from the etching process on the electrode supporting the wafer eventually becomes thick enough to interfere with a semiconductor wafer's contact with the electrode. The result is non-uniform etching across the semiconductor wafer as well as interfering with proper wafer transfer. Non-uniformity tends to vary the line side wall profiles across the wafer and thus reduces final device yields.

This problem is obviated by the use of the cleaning wafer of the present invention which is of approximately the same thickness as a semiconductor wafer and which is formed in the shape of a polygon. The distance between the opposing points of the polygon approximate the diameter of a semiconductor wafer. The cleaning wafer is thus able to pass through the machine and is also recognized by sensors in the machine as a product bearing wafer. The Plasma-Therm etcher described previously herein needs to sense the presence of a wafer in order to provide rf power for the generation of a plasma used for etching.

After a period of production etching of semiconductor wafers has formed deposits on the electrode, the cleaning wafer is inserted into the machine. An oxygen plasma is then generated in the etching chamber of the etching machine which converts the deposits on the electrode to gaseous by-products which are pumped away. The polygonal shape of the cleaning wafer exposes the deposits to the oxygen plasma. The etching chamber is thus cleaned without exposure to the atmosphere and while maintaining etching uniformity and improving production efficiency. Another series of semiconductor wafers can then be etched in the etching machine.

Viewed from one aspect, the present invention is directed to a method of operating an etching machine. A polygon shaped cleaning wafer is inserted into the etching machine after a first series of etching operations on product bearing wafers has been completed. Oxygen is then flowed into the etching machine. Rf power is applied to an electrode in the etching machine for an interval of time. The cleaning wafer is then removed from the etching machine, and a product containing wafer is then inserted into the etching chamber and etching operations are instituted.

Viewed from another aspect, the present invention is directed to a an in-line etching machine comprising a chamber with an electrode contained therein which is adapted to hold product bearing wafers, each of which has a flat on its circumference. The in-line etching machine comprises a polygon cleaning wafer that is sized so as to be capable of being supported on the electrode and has a plurality of flats such that deposits that form in the chamber and on the electrode under an area of the product bearing wafers in which the flat exists during etching of the product bearing wafers can be removed without opening the chamber during a clean cycle of operation of the in-line etching machine.

Viewed from still another aspect, the present invention is directed to a method of operating an etching machine. The method comprises inserting a polygon shaped cleaning wafer into the etching machine after a first series of etching operations on product bearing wafers, each having a flat, has been completed and residue from the product bearing wafer has deposited on an electrode of the etching machine and on interior portions of the etching chamber. The machine is then energized so as to cause the reside from product bearing wafer to be removed from the electrode and the interior portions the machine. Another product bearing wafer having a flat is then inserted into the machine. The machine is then energized so as to etch the other product bearing wafer.

The invention will be better understood from the following more detailed description taken in conjunction with the accompanying drawings and claims.

Figure 1:
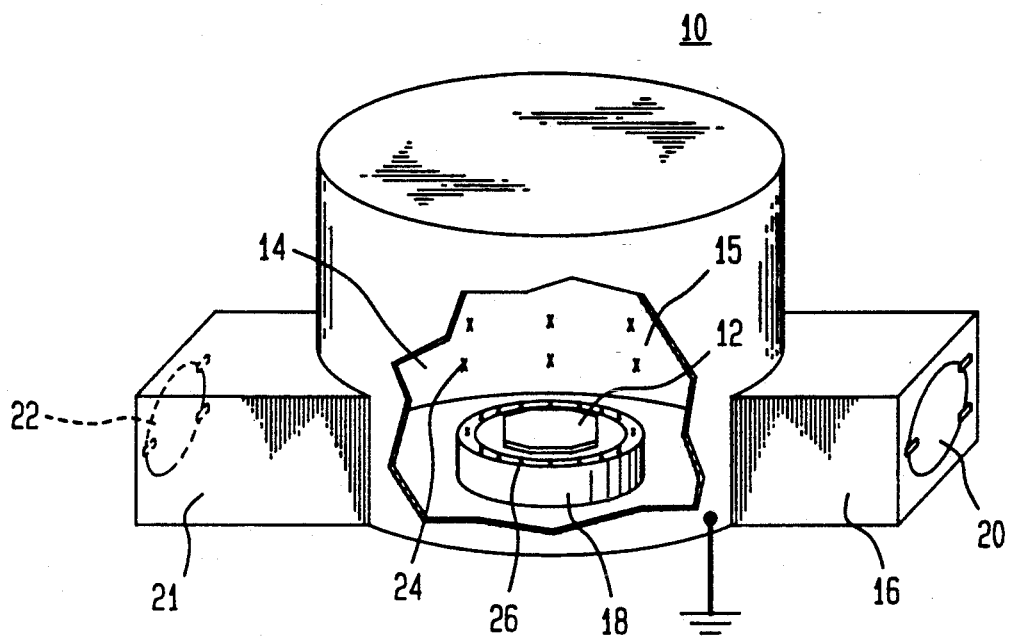
FIG. 1 shows an etching machine with a cleaning wafer in a chamber thereof in accordance with the apparatus and a method of the present invention.

The drawing may not necessarily be to scale.

DETAILED DESCRIPTION

Referring now to FIG. 1, there is shown an etching machine 10 with a cleaning wafer 12 in an etching chamber 14 thereof in accordance with apparatus and a method of the present invention. The etching chamber 14 (shown with a portion thereof broken away) of machine 10 has an electrode 18 contained therein. The cleaning wafer 12 is mounted on the electrode 18. Machine 10 also comprises an input chamber 16 having a door 20, and an output chamber 21 having a door 22. In the chamber 14 are symbolically shown deposits (e.g., of polymer) 24 and annular ring 26 which have accumulated on interior walls 15 of chamber 14 and on electrode 18, respectively, as a result of previous etching of product bearing (semiconductor) wafers 30 (not shown in FIG. 1 but shown in FIG. 2).

A production run of product bearing (e.g., semiconductor) wafers 30 (shown in FIG. 2) typically consists of a magazine of 25 wafers which are inserted into input chamber 16. Vacuum pumps (not shown) remove air and water vapor from input chamber 16 so that each semiconductor wafer 30, in turn, is transported through an interlock (not shown) into etching chamber 14 in which a gas, or mixture of gases, is maintained at a low pressure by another vacuum pump (not shown). The semiconductor wafer 30 is moved with a C-shaped arm (not shown) onto electrode 18 which is connected to a radio frequency (rf) power source (not shown). Sensors (not shown) within etching chamber 14 detect the presence of a semiconductor wafer 30 and enable the rf power to be supplied to electrode 18. Interior walls 15 of etching chamber 14 are typically held at ground potential. The rf power ionizes the gas in the etching chamber to create very active ions of the gas or gases which combine with exposed areas of the semiconductor wafer 30, and, to a lesser extent, with the masking layer which is in the form of the desired pattern. Most of the by-products of the reactions are pumped away from the etching chamber 14, but some of these by-products become the deposits 24 on the interior walls 15 of the etching chamber 14 and the annular ring 26 upon electrode 18.

After a first series of semiconductor wafers 30 has been etched in a manner prescribed for the etching of a particular layer, the annular ring 26 has deposited on the electrode 18 which supported each semiconductor wafer 30. Contributions to this annular ring 26 are caused by the random placement of the flat on the circumference of each semiconductor wafer 30, as well as on the wafer 30 itself, which exposes a sector of the supporting electrode 18. The aggregate of these random sector deposits is the annular ring 26 of polymer which ultimately separates subsequent semiconductor wafers 30 from the electrode 18 and results in non-uniform etching as well as interfering with proper wafer transfer. Non-uniformity exceeding seven percent is beyond some specified limits.

A sheet of material which is of the same composition as the interior of the chamber, in this case a sheet of aluminum in order to minimize the potential for contamination by other elements, is cut to the shape of a polygonal cleaning wafer 12. The distance between opposing edges is approximately the diameter of a semiconductor wafer in production. An octagonal shape has been found to expose sufficient area on the electrode.

During a cleaning operation, the cleaning wafer 12 is passed through door 20 and is placed in the input chamber 16. The input chamber 16 is then pumped down, and the cleaning wafer 12 is transported through an interlock (not shown) into the etching chamber 14 and placed upon the electrode 18. The annular ring 26, which was formed by previous etching of semiconductors wafers 30 (shown in FIG. 2), is also on electrode 18. Most of the annular ring 26 is exposed adjacent to each face of the cleaning wafer 12. In the aforementioned Plasma-Therm, Models A360 and A368, a wafer must be within the etching chamber so that sensors within the etching chamber can energize the rf power supply. The cleaning wafer 12 thus satisfies the dual requirements of exposing most of the annular ring 26 and satisfying the requirements of the etching machine's sensors (not shown) to provide rf power. The flow of etching gases is next replaced with oxygen. Rf power is applied when the pressure of oxygen is stabilized. The rf power creates very active oxygen ions which combine with the polymer (deposit) on the electrode 18 to form gaseous by-products which are pumped away. After the oxygen plasma cycle, a C-shaped arm (not shown) transports the cleaning wafer 12 through an interlock (not shown) into the output chamber 21 which is maintained at a low pressure. Using the same procedure as is used to return a semiconductor wafer 30 which is being processed, the cleaning wafer 12 is removed from the output chamber 21 through the door 22. The etching chamber 14 and the electrode 18 are now free of the polymer deposits 24 and annual ring 26. A second series of semiconductor wafers 30 is next placed into the input chamber 16 to repeat the production etching process.

Figure 2:
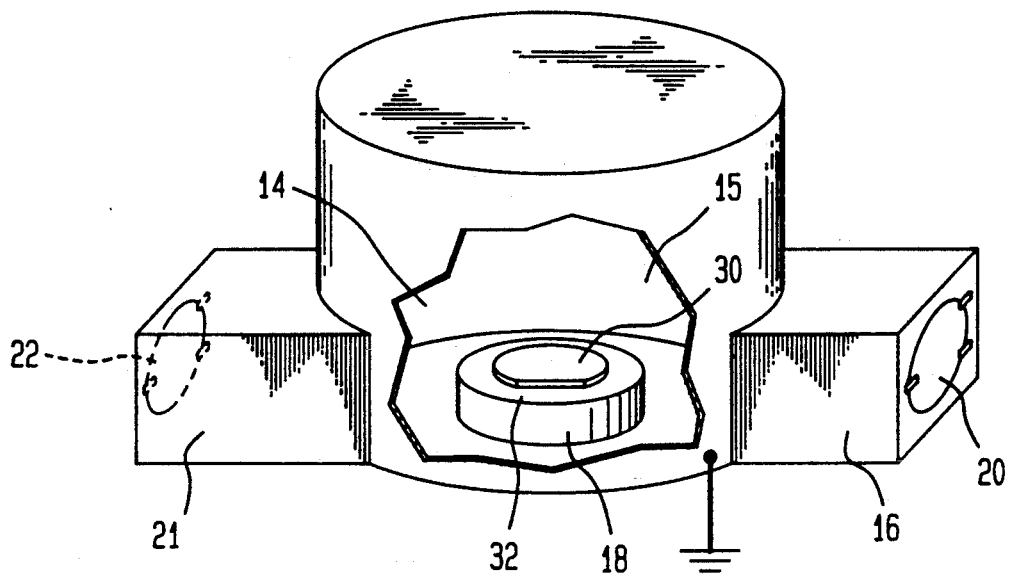
FIG. 2 shows the etching machine of FIG. 1 after same has been cleaned in accordance with the method of the present invention and a product bearing wafer has been placed in the chamber.

Referring now to FIG. 2, there is shown the same apparatus of FIG. 1 with a semiconductor wafer 30 on electrode 18 in chamber 14 of etching machine 10 instead of the cleaning wafer 12. All deposits 24 and annual ring 26 shown in FIG. 1 have been removed from chamber 14. The semiconductor wafer 30 has a flat 32 ground on a portion of its circumference.

In one production line fifty semiconductor wafers 30 are etched and then the cleaning wafer 12 is inserted into the machine 10 on electrode 18 for an oxygen plasma run. The etching chamber 14 is never opened to atmosphere as in the case of the prior solvent wipedown procedure which was required after every 100 to 150 wafers 30. Experience has shown a saving of four to eight hours of etching machine 10 down-time each week and improved uniformity in etching.

The embodiments described herein are merely illustrations of the general principles of the invention. Various modifications are possible consistent with the spirit of the invention. For example, a wide variety of materials may be used to create the cleaning wafer which will be used to create the cleaning wafer Still further, an undersized circular cleaning wafer would also expose the annular polymer ring if the machine could locate it within the inner diameter of the polymer ring. Still further, a multitude of flats can be used to create the cleaning wafer. Furthermore, deposits in reactive ion etching machines could be cleaned in the same manner.

What is claimed is:

1. A method of operating an etching machine comprising the steps of:
   inserting a polygon shaped cleaning wafer into the etching machine after a first series of etching operations on product bearing wafers has been completed;
   flowing oxygen into the etching machine;
   applying rf power to an electrode in the etching machine for an interval of time;
   removing the cleaning wafer from the etching machine; and
   inserting another product containing wafer into the etching machine and performing etching operations thereon.

2. The method of claim 1 wherein the cleaning wafer is comprised of the same material as the interior of the etching machine.

3. The method of claim 1 wherein the cleaning wafer is an octagon.

4. A method of operating an in-line etching machine comprising the steps of:
   forming a cleaning wafer into the shape of a polygon;
   inserting the cleaning wafer between a first series of product bearing wafers and a second series of product bearing wafers;
   running the in-line etching machine in a manner prescribed for the etching of a particular layer from the first series of product bearing wafers;
   purging an etching chamber within the in-line machine with nitrogen;
   introducing the cleaning wafer into the etching chamber;
   establishing a pressure and flow rate of oxygen within the etching chamber;
   applying rf power to an electrode within the in-line machine for an interval of time;
   removing the cleaning wafer from the etching chamber;
   purging the oxygen from the etching chamber;
   resuming the etching process for a particular layer of a second series of product bearing wafers.

5. The method of claim 4 wherein the cleaning wafer is comprised of the same materials as the interior of the etching chamber.

6. The method of claim 4 wherein the cleaning wafer is an octagon.

7. The method of claim 4 wherein the distance between opposing corners of the polygon is approximately equal to the diameter of a semiconductor wafer.

8. A method for cleaning of a plasma in-line etching machine for the processing of product bearing wafers comprising the steps of:
   inserting a polygon shaped cleaning wafer into a chamber of the plasma etching machine between a first series of product bearing wafers and a second series of product bearing wafers;
   running the in-line etching machine in a manner prescribed for the etching of a particular layer from the first series of product bearing wafers;
   purging an etching chamber within the in-line machine with nitrogen;
   introducing the cleaning wafer into the etching chamber;

establishing a pressure and flow rate of oxygen within the etching chamber;

applying rf power to an electrode within the in-line machine for an interval of time;

removing the cleaning wafer from the etching chamber;

purging the oxygen from the etching chamber; and resuming the etching process for a particular layer of the second series of product bearing wafers.

9. The method of claim 8 wherein the cleaning wafer is comprised of the same materials as an interior of the etching chamber.

10. The method of claim 8 wherein the cleaning wafer is an octagon.

11. The method of claim 8 wherein the distance between opposing corners of the polygon is approximately equal to the diameter of a semiconductor wafer.

12. The method of claim 9 wherein the thickness of the cleaning wafer is approximately the same thickness as that of a semiconductor wafer.

13. An in-line etching machine having a chamber with an electrode contained therein which is adapted to hold semiconductor wafers, each of which has a flat and which are to be etched in the machine, the in-line etching machine comprising a polygon cleaning wafer being sized so as to be capable of being supported on an electrode and having a plurality of flats such that deposits that form in the chamber and on the electrode under an area of the semiconductor wafers in which the flat exists during etching operations of the product bearing wafers can be removed during a clean cycle of operation of the in-line etching machine without opening the machine.

14. The apparatus of claim 13 wherein the cleaning wafer is comprised of the same material as the interior of the in-line etching machine.

15. The apparatus of claim 13 wherein the distance between opposing corners of the polygon is approximately equal to the diameter of a semiconductor wafer.

16. The apparatus of claim 13 wherein the cleaning wafer is in the form of an octagon.

17. A method of operating an etching machine comprising the steps of:

inserting a polygon shaped cleaning wafer onto an electrode within a etching chamber of the etching machine after a first series of etching operations on product bearing wafers each having a flat has been completed and residue from the product bearing wafer has deposited on an electrode and on interior portions thereof;

energizing the machine so as to cause the residue from product bearing wafers to be removed from the electrode and the interior portions the machine;

inserting an other product bearing wafer having a flat into the machine; and energizing the machine so as to etch the other product bearing wafer.

* * * * *